United States Patent [19]

Moodera et al.

[11] Patent Number: 5,629,922
[45] Date of Patent: May 13, 1997

[54] ELECTRON TUNNELING DEVICE USING FERROMAGNETIC THIN FILMS

[75] Inventors: Jagadeesh S. Moodera, Somerville; Terrilyn Wong, Cambridge, both of Mass.; Lisa Kinder, Charleston, W. Va.; Robert H. Meservey, Lexington, Mass.

[73] Assignee: Massachusetts Institute of Technology, Cambridge, Mass.

[21] Appl. No.: 407,761

[22] Filed: Mar. 21, 1995

Related U.S. Application Data

[63] Continuation-in-part of Ser. No. 393,083, Feb. 22, 1995, abandoned.

[51] Int. Cl.⁶ .............................. G11B 9/00; G11C 11/15; H01L 27/22
[52] U.S. Cl. ..................... 369/126; 369/120; 365/158; 360/113; 257/421
[58] Field of Search ................................ 369/126, 120, 369/121, 288; 365/129, 157, 158, 171, 173, 147, 63, 48; 257/421, 427, 425, 536; 338/32 R; 324/252; 360/113

[56] References Cited

U.S. PATENT DOCUMENTS

| | | | |
|---|---|---|---|
| 4,853,810 | 8/1989 | Pohl et al. | 360/103 |
| 5,390,061 | 2/1995 | Nakatani et al. | 360/113 |
| 5,416,353 | 5/1995 | Kamiguchi et al. | 257/421 |
| 5,422,571 | 6/1995 | Gurney et al. | 324/252 |
| 5,432,373 | 7/1995 | Johnson | 257/421 |
| 5,477,482 | 12/1995 | Prinz | 365/129 |
| 5,500,633 | 3/1996 | Saito et al. | 338/32 |

OTHER PUBLICATIONS

"Metallic Ferromagnets," in *Physics Reports*, Meservey, R. and Tedrow, P.M., eds. (North Holland) pp. 200–217 (Mar. 1994).

Julliere, M., "Tunneling Between Ferromagnetic Films," *Physics Letters*, 54A(3):225–226 (Sep. 1975).

Maekawa, S. and Gafvert, U., "Electron Tunneling Between Ferromagnetic Films," *IEEE Transactions on Magnetics*, MAG–18 (2):707–708 (Mar. 1982).

Yaoi, T. et al., "Dependence of Magnetoresistance on Temperature and Applied Voltage in a 82Ni–Fe/Al–Al₂O₃/Co Tunneling Junction," *Journal of Magnetism and Magnetic Materials*, 126:430–432 (1993).

Miyazaki, T. et al., "Large Magnetoresistance Effect in 82Ni–Fe/Al–Al₂–O₃/Co Magnetic Tunneling Junction," *Journal of Magnetism and Magnetic Materials*, 98:L7–L9 (1991).

Slonczewski, J.C., "Magnetic Bubble Tunnel Detector," *IBM Technical Disclosure Bulletin*, 19(6):2328–2336 (Nov. 1976).

*Primary Examiner*—Georgia Y. Epps
*Assistant Examiner*—Kim-Kwok Chu
*Attorney, Agent, or Firm*—Hamilton, Brook, Smith & Reynolds, P.C.

[57] ABSTRACT

Ferromagnetic/insulator/ferromagnetic tunneling has been shown to give over 10% change in the junction resistance with H less than 100 Oe, at room temperature but decreases at high dc-bias across the junction. Using such junctions as magnetic sensors or memory elements would have several advantages; it is a trilayer device and does not strongly depend on the thickness of FM electrodes or the tunnel barrier; submicron size is possible with high junction resistance and low power dissipation. The magnitude of the effect is consistent with the simple model of spin-polarized tunneling between ferromagnets.

36 Claims, 10 Drawing Sheets

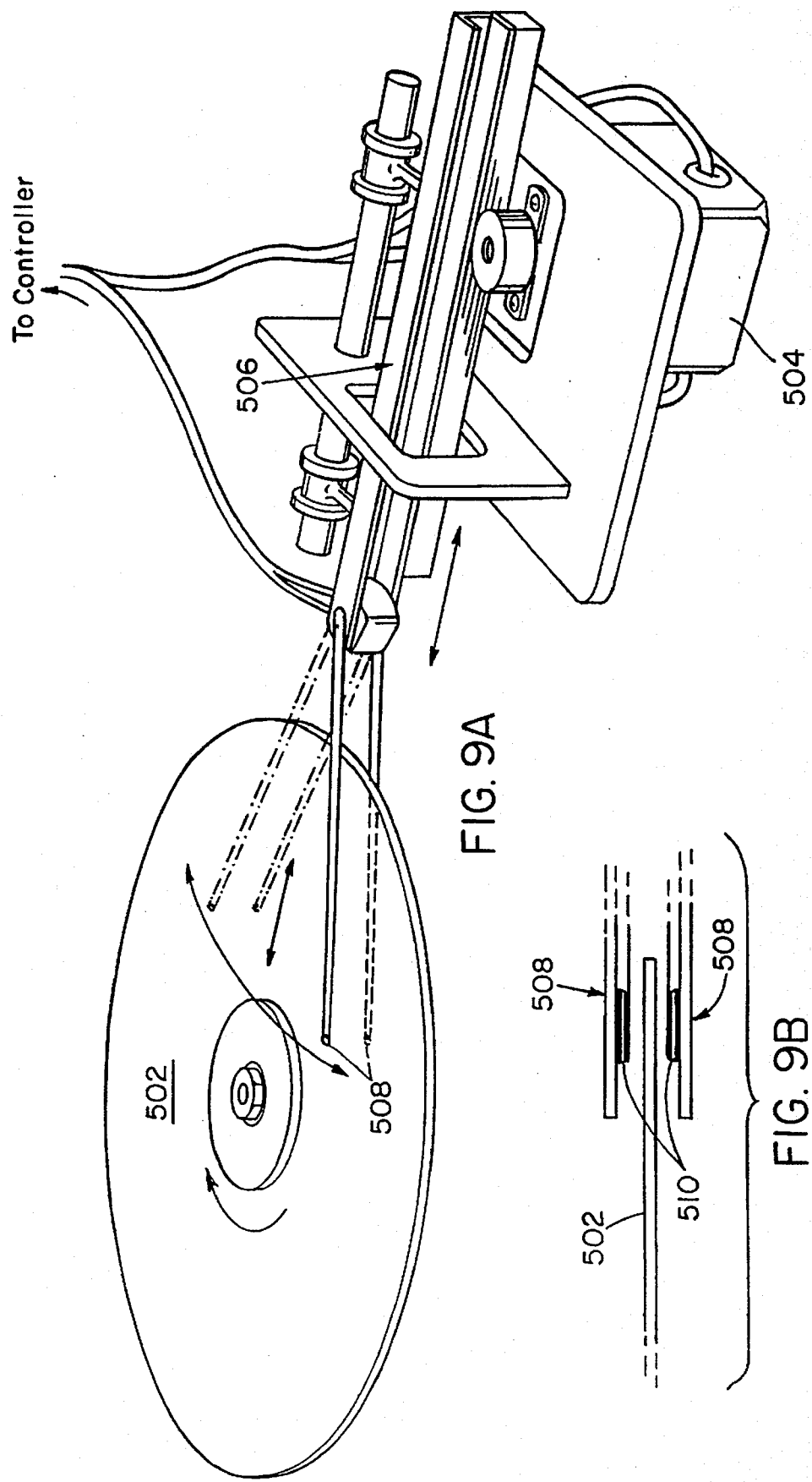

ELECTRON TUNNELING DEVICE USING FERROMAGNETIC THIN FILMS

GOVERNMENT SUPPORT

The invention described herein was supported in whole or in part by NSF Grant No. DMR-9023400 and ONR Grant No. N00014-92-J-1847. The government has certain rights in the invention.

RELATED APPLICATION

This is a Continuation-in-Part of U.S. application Ser. No. 08/393,083 which was filed on Feb. 22, 1995 (Attorney's Docket No. MIT-6801), now ABANDONED.

BACKGROUND

Electron tunneling is a quantum phenomenon in which electric current can pass from one electrode through a thin insulating barrier layer into a second electrode. This three layer system—electrode, barrier and counter-electrode—is referred to as a tunnel junction. Where the electrodes are made of ferromagnetic material, a ferromagnet-insulator-ferromagnet (FM-I-FM) trilayer tunnel junction is formed. The intervening thin insulating layer is known as "tunnel barrier" and has thickness less than about 10 nanometers. The current flowing across such a trilayer tunnel junction structure depends on the relative magnetization (M) direction of the FM electrodes. The junction resistance is higher when the magnetization of one FM is antiparallel to that of the other FM and lower when they are parallel to one another.

Julliere, Phys. Lett. 54A, 225 (1975), proposed an explanation for the change in junction resistance with change in magnetization direction. His explanation is based on the conduction electron spin polarization values of the FM electrodes, a model that later groups have essentially adopted. According to this model, if $P_1$ and $P_2$ are the conduction electron spin polarizations of the two FM electrodes, as measured by spin-polarized tunneling experiments with superconductors, the change in the tunnel conductance or resistance is given by:

$$\Delta R/R = (R_a - R_p)/R_a = (G_p - G_a)/G_p = 2P_1P_2/(1 + P_1P_2) \quad (1)$$

Here $R_p$ and $R_a$ are the resistances with magnetization of the electrodes parallel and antiparallel respectively and $G_p$ and $G_a$ are the equivalent conductances. For an Fe—Co tunnel junction, with polarizations of 40% and 34% respectively for the two FM electrodes, the above expression yields a 24% ($\Delta R/R$) change in the tunneling conductance between antiparallel and parallel orientation of M in the two FM electrodes.

This is an ideal case, which neglects limiting factors, such as, domain walls in the junction area, interfacial and barrier spin scattering, direct coupling between the two FM films, and surface degradation of FM films. In practice, all of these factors and perhaps others diminish the expected effect.

Reports by various groups using mainly nickel oxide (NiO) and aluminum oxide ($Al_2O_3$) barriers between nickel (Ni) and cobalt (Co) electrodes establish the occurrence of a change in resistivity with change in magnetization direction for FM-I-FM tunneling. However, in most of these cases, the change in the tunnel resistance $\Delta R/R$ was 2–6% at 4.2 K., and only fractions of a percent at room temperature. Recent experimental work by Miyazaki et al., J. Magn. Magn. Mater. 126, 430 (1993), showed a 2.7% change in the resistance at room temperature. In their experiment, part of the 150 Å Al film over a permalloy film was oxidized to form NiFe/Al—$Al_2O_3$/Co tunnel junctions.

Scientists, for many years, have known in theory about the fundamental dynamics of the tunnel resistance arising from conduction electron spin polarization. However, the past efforts in this area have failed to produce an adequate level of change in the tunneling resistance ($\Delta R/R$) for any practical and effective use of the phenomenon. Consequently, a need exists for an FM-I-FM trilayer junction construction in which the magnitude of the junction resistive change is at least 10%. Such a junction would then find a practical use as a memory or sensor device.

SUMMARY OF THE INVENTION

The present invention relates to a method for fabricating a FM-I-FM trilayer thin film device forming a tunnel junction and the use of the resultant device as a memory device or as a sensor. A small change of magnitude, approximately 100 oersted (Oe), in applied magnetic field is capable of changing the junction resistance of the device by at least 10% at room temperature. The method of forming the device includes selecting and preparing the material of one of the two FM layers, e.g. the bottom layer, such that it provides high coercive force, in the range of 100–1000 Oe and high electron spin polarization. The method also further includes selecting and preparing counter electrode, or the top layer, to have a relatively lower coercive force, in the range of 20–100 Oe. Note: "coercive force" of a ferromagnet refers to the gross magnitude of applied magnetic energy required to reverse the magnetization direction of the ferromagnet. The insulator layer between the FM layers should provide a good tunnel barrier.

More specifically, junction fabricating steps include forming a thin Si nucleating layer on a cooled glass substrate, followed by formation of the bottom FM film or layer. Then an aluminum (Al) film is formed on the exposed surface of the first FM layer. The Al film is subsequently oxidized by a glow discharge in oxygen to create an insulating tunnel barrier layer of $Al_2O_3$. Lastly, the top FM electrode is formed over the insulating layer at room temperature. All of the above steps should be done within a reactor without exposing the device to air In the present invention, some of the problems leading to low values of resistance change ($\Delta R/R$) in spin-polarized tunneling of FM-I-FM trilayer have been solved. Over a ten percent change in the tunneling resistance with respect to magnetic field (H) variation has been observed in devices constructed in accordance with the invention. This variation has been observed consistently and is reproducible. In some cases, as much as 11.8% change was seen. This increase in $\Delta R/R$ is believed to depend, inter alia, on a decrease in surface roughness, which apparently directly couples the two electrodes ferromagnetically. Also, the quality of the intervening insulator between the FM electrodes is significantly improved over the prior art devices. This is believed to be important in keeping the surface integrity of the FM electrodes. The results of the present invention show a significant promise for application in magnetic recording devices, such as high density fixed disk drives found in personal computers. Accordingly, the present invention provides a spin-polarized electron tunneling device and method which overcomes the past ineffectiveness for application in nonvolatile memory or sensor elements.

The above and other features of the invention including various novel details of construction and combinations of parts will now be more particularly described with reference to the accompanying drawings and pointed out in the claims. It will be understood that the particular devices and methods embodying the invention are shown by way of illustration only and not as limitations of the invention. The principles and features of this invention may be employed in varied and numerous embodiments without departing from the scope of the invention.

BRIEF DESCRIPTION OF THE DRAWINGS

FIG. 9A is a schematic/prospective drawing of a magnetic storage disk drive system.

FIG. 9B is an enlarged view of a read-write sensor head according to the invention.

DETAILED DESCRIPTION OF THE PREFERRED EMBODIMENTS

Figure 1:
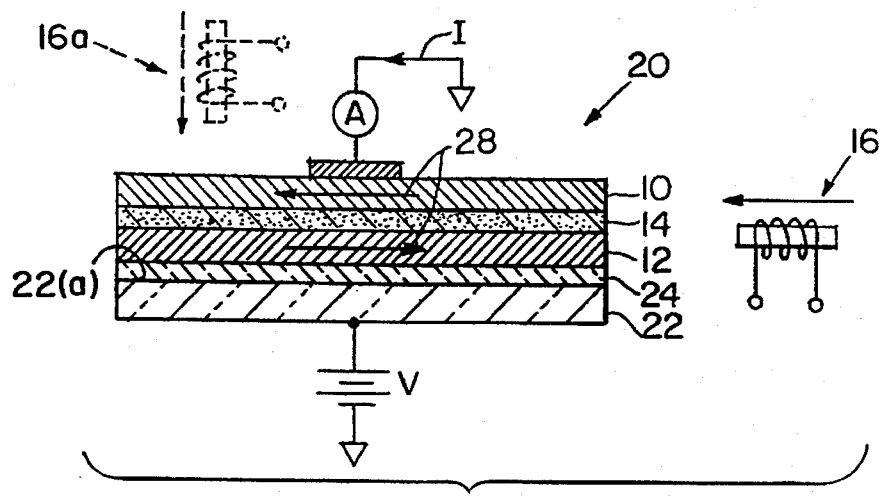
FIG. 1 is a schematic cross sectional diagram of a typical ferromagnet-insulator-ferromagnet trilayer construction in accordance with the invention.

Referring now to the drawings, FIG. 1 describes a typical FM-I-FM trilayer construction of a preferred embodiment of the invention, wherein the tunneling current is represented by "I" and the voltage across the junction by "V". An electromagnetic energy source 16 affects magnetization direction 28 by applying small magnitude of magnetic field across the junction. To produce such effect, the source may be positioned virtually in any direction with respect to the junction (see e.g. 16A). The FM-I-FM thin film planar tunnel junctions of the present invention are prepared in a high vacuum (10$^{-7}$ torr) evaporation system (not shown). This embodiment of a trilayer tunnel junction device 20 of the present invention is preferably fabricated as follows.

A substrate 22 having a flat smooth upper surface 22(a) is initially cooled to a liquid-nitrogen temperature by placing it in contact with a liquid-nitrogen cooled metal surface. The cooled surface 22(a) is then covered with a layer about 10 Å of a suitable seeding layer 24, such as Si. Next, a first FM metal film 12, about 80 Å thick and 0.2 mm wide is formed on the seeding layer. An aluminum precursor film 14, about 12–18 Å thick, is then deposited over the entire top surface of the first FM layer. After bringing the substrate to room temperature, the Al film 14 is oxidized by a glow discharge in oxygen at about 60 microns to create an insulating tunnel barrier layer of Al$_2$O$_3$. (NOTE: spin polarized tunneling experiments with Al$_2$O$_3$ barriers have shown that this procedure oxidizes about 12–14 Å of the original Al film). After pumping down again to create a vacuum, cross strips of a top FM electrode 10 about 100–300 Å thick and about 0.3 mm wide are formed on the barrier layer 14 at room temperature.

Device 20 made as above should have tunnel junction resistances ranging from hundreds of ohms to tens of kilo-ohms, depending on the duration of the glow discharge and the type of FM material used for the electrodes. To affect magnetization direction in each of the FM electrodes, the trilayer tunnel junction 20 may be oriented with the film (junction) plane parallel (as shown) or perpendicular or any direction to the direction of the applied field 16.

In a preferred embodiment, a trilayer tunnel junction, as shown in FIG. 1, comprises a cobalt iron (CoFe) electrode 12 as the first FM layer and either a Co or NiFe electrode 10 as the second FM layer. It is preferred that the FM layers have high conduction electron spin polarization (P) of 0.3 or greater. Preferably, the layers are formed by a vacuum evaporation process but other suitable process may be substituted, such as sputtering, electroplating or laser ablation. Preferably the substrate is glass but other suitable materials include silicon, germanium, gallium arsenide wafers, mica, and insulators like magnesium oxide or aluminum oxide. Preferably the seeding layer is formed of a material having high melting point of 1000 degrees Celsius or better, such as silicon, germanium or titanium oxide.

Figure 2A:
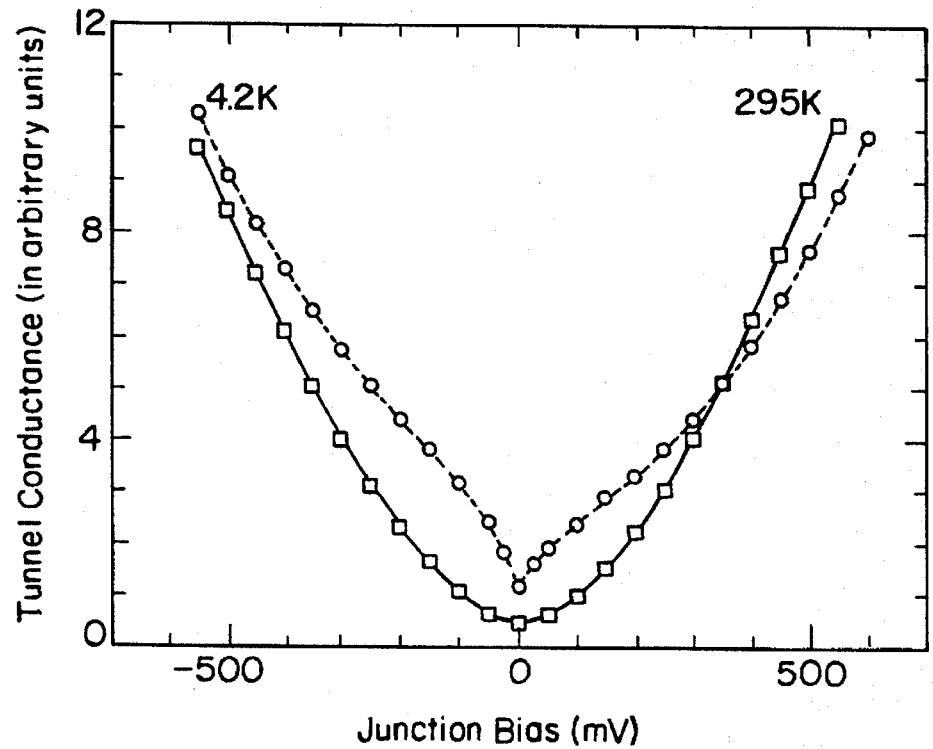
FIG. 2A is a plot of tunnel conductance as a function of applied dc-bias for a CoFe/Al$_2$O$_3$/NiFe trilayer junction at 4.2 K. and 295 K. in zero magnetic field.
Figure 2B:
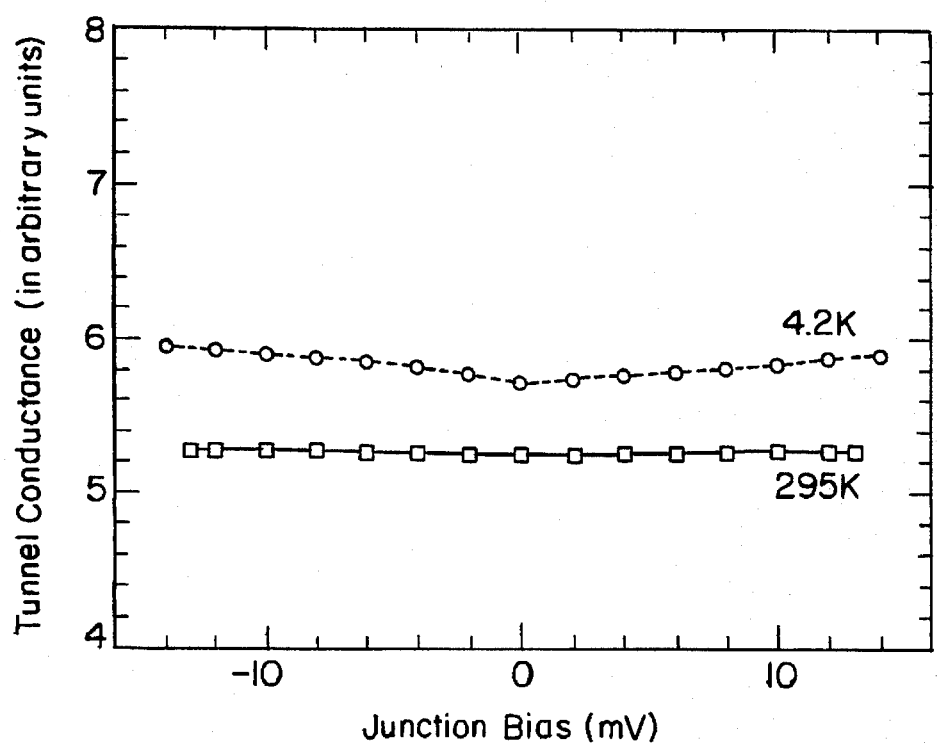
FIG. 2B is an enlarged view of the tunneling conductance in FIG. 2A near the zero bias crossover.

The quality of the tunnel junctions may be verified by the current-voltage and conductance (G) measurements at various temperature S(T). In FIG. 2A and 2B the tunnel conductance G is plotted against the applied voltage across a CoFe/Al$_2$O$_3$/NiFe junction at 295 K. and 4.2 K. Instead of NiFe, using Co as the top electrode forming a CoFe/Al$_2$O$_3$/Co junction showed identical behavior. At low bias, as shown in FIG. 2B, G is nearly independent of the bias up to about ±15 mV, as it should be for a good tunnel junction with an Al$_2$O$_3$ tunnel barrier. In the higher bias region, as shown in FIG. 2A, close to parabolic dependence of G is observed. Such dependence is regularly seen for high quality Al/Al$_2$O$_3$/FM junctions. The overall shape of conductance is about the same at 295 K. and 77 K. The percent change in junction resistance, however, is increased by tens of percent as the temperature drops below the room temperature (295 K.).

The current-voltage data at 295 K. was fitted to Simmons' theory of tunneling to approximate the tunnel barrier height ($\phi$) and thickness (d). In the embodiments having NiFe and Co electrodes, the value of $\phi$ was about 1.9 ev and the barrier thickness about 16 Å. This agrees well with the standard Al/Al$_2$O$_3$/FM tunnel junction parameters. These data together with the I-V and G-V measurements and their temperature dependence indicates that tunneling is the major conduction process in these junctions.

Figure 3A:
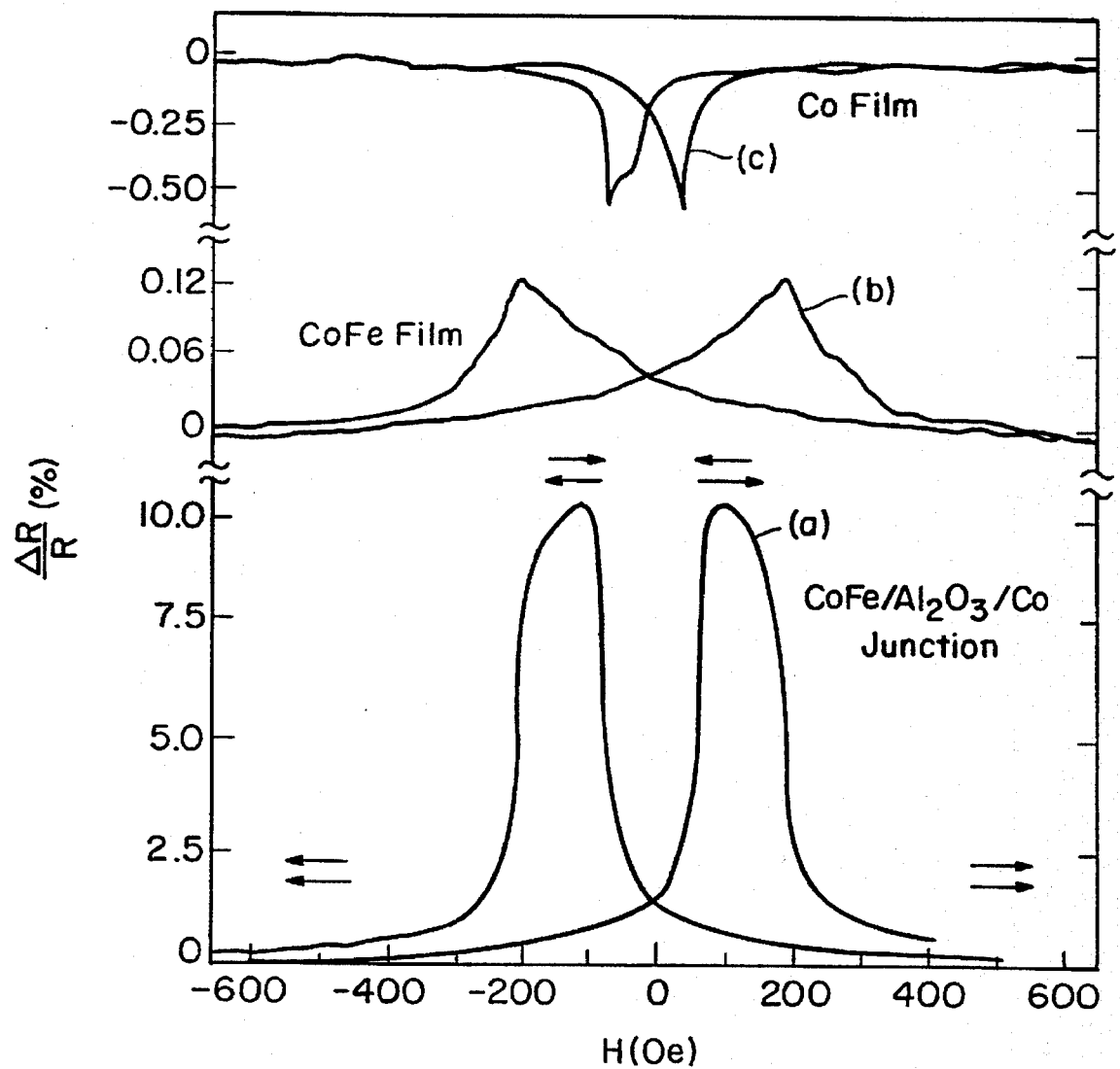
FIG. 3A is a set of plots showing change in resistance as a function of applied magnetic field H in oersted at 295 K. for a ferromagnet pair and a FM-I-FM trilayer junction.

Unlike the conductance measurement, the field dependence of junction resistance may be performed by a four-terminal technique. Results of one such measurement is shown in FIG. 3A for a CoFe/Al$_2$O$_3$/Co junction (replacing Co with NiFe as the top electrode 10 [FM1] shows similar behavior). In FIG. 3A, the percent ratio ΔR/R of a CoFe/Al$_2$O$_3$/Co trilayer junction as a function of H is shown in curve (a). The upper two curves in FIG. 3A, (b) and (c), represent the magnetic field responses of the bottom (CoFe) and top (Co) FM layers, respectively. Each of these curves shows the variation in the resistance R of the films per se over the same range of magnetic field at 295 K.

The arrows on the junction curve (a) indicate the magnetization directions of the two ferromagnet films. Note, in particular, the difference in the coercive field magnitude (H$_c$, i.e., magnitude of field intensity measured at the resistance peak) between the two FM layers. At the top, H$_c$ for Co is approximately 100 Oe, whereas H$_c$ for CoFe at the bottom is significantly greater at 200 Oe. In general, relatively small magnetoresistance changes are observed for the two films when measured individually. The presence of a maximum or minimum in resistance vs. H is determined by the field and current directions. The coercive force for the films determined from the M-H loop measurement using a SQUID magnetometer, agrees with the above conclusion.

In FIG. 3A, it is shown that as the magnetic field decreases from a high value, R increases slowly. Upon reversing the field, R begins to increase sharply, resulting in a resistive peak (see the right peak on the bottom of FIG. 3A). With further increase in H, the resistance drops quickly and attains a constant value. This behavior is seen for H both parallel and perpendicular to the junction plane. For the latter case, however, the peaks are broader and shifted to higher fields as one would expect in these FM films which have an in-plane easy axis of magnetization. The change in the junction resistance with respect to the absolute value at the peak, ΔR/R, for this junction is 10.6% at 295 K. In several tens of junctions, over a 10% effect has been consistently observed at room temperature; some junctions showed values up to 11.8%. This change in R with field is far higher than previously reported values.

Figure 4:
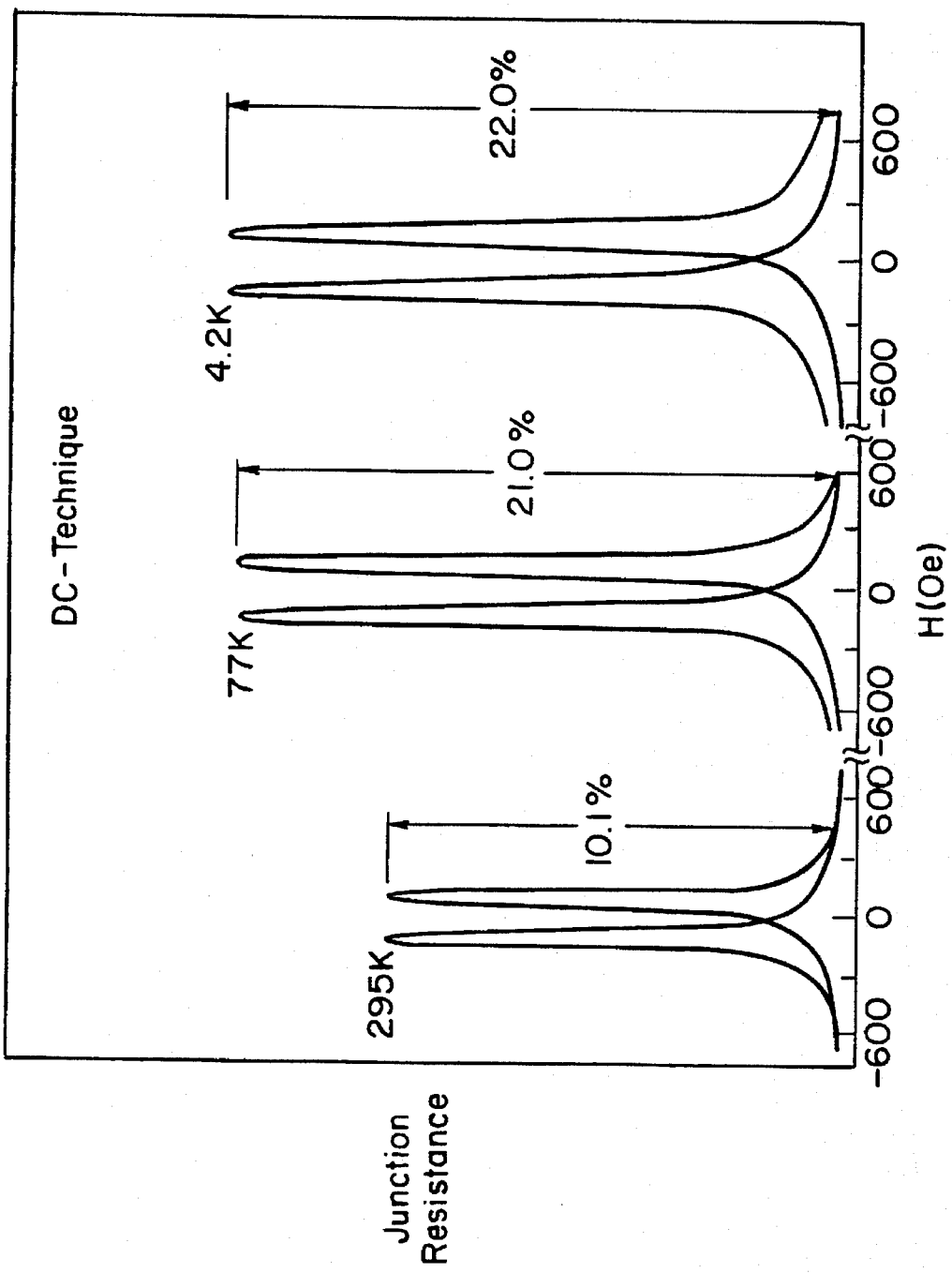
FIG. 4 is a set of plots showing percent change in tunnel resistance measured by dc-technique as a function of applied magnetic field for a CoFe/Al$_2$O$_3$/NiFe trilayer junction at three temperature settings.

In general, a percentage change of junction resistance nearly doubled at 77 K. compared to a value taken at 295 K. A further increase in resistive change occurred upon cooling the junction to 4.2 K., reaching values up to 24% in some cases. The temperature dependence of R vs. H for a CoFe/Al$_2$O$_3$/Co junction measured with a dc source is shown in FIG. 4. The dc-current of 1 μA used in these measurements corresponds to about 3 mV and 6 mV at 295 K. and 4.2 K. respectively. As temperature decreases, the resistance peak broadens slightly, and, in addition, there is a shift in the peak position to higher field values.

The variation of the tunnel junction resistance (or voltage) change with H at different temperature (see FIG. 4) is, in part, due to the change in coercive forces of the FM materials. It follows that the magnitude of the change depends crucially on the difference of the coercive field magnitudes (H$_c$) in the two FM electrodes. This was noted in FIG. 3A, wherein a factor of two difference in H$_c$ between the top and bottom FM layers resulted in a significant change in the junction resistance.

In general, as T decreases, the coercive field for the two films tend to move further apart, allowing the antiparallel alignment to remain for a wider range of H and giving rise to greater changes in ΔR/R values. In a few rare cases, however, H$_c$ for CoFe (bottom electrode) may remain virtually unchanged while the top Co film undergoes a large increase in H$_c$ upon cooling to 77 K. Such response causes the two coercive forces to nearly overlap.

Figure 3B:
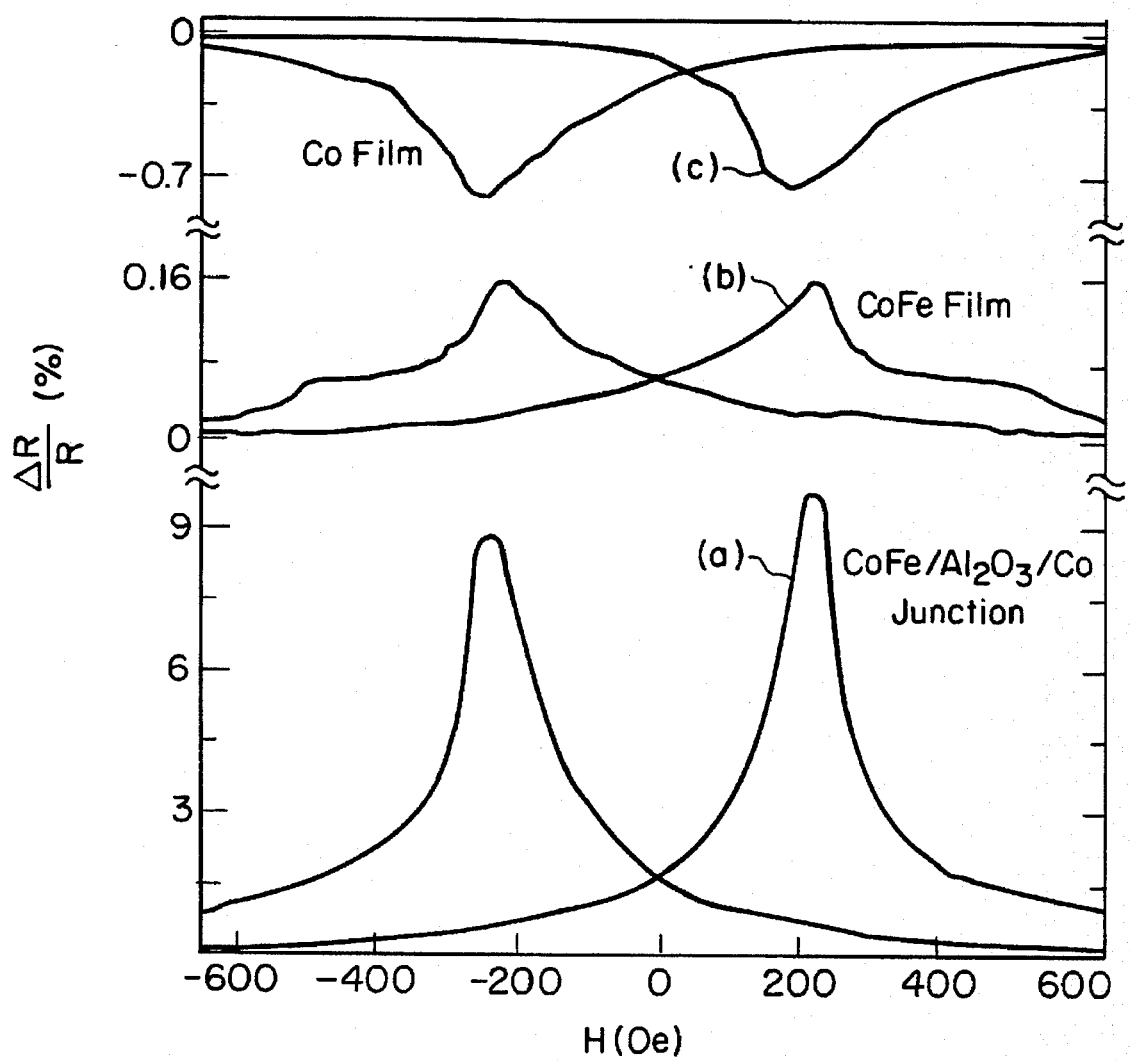
FIG. 3B is another set of plots showing resistive change of ferromagnets and a FM-I-FM trilayer tunnel junction with respect to applied magnetic field H at 77 K.

FIG. 3B demonstrates one such exceptional case where the coercive forces of the ferromagnet pair, represented by the peaks or dips in curves (b) and (c), nearly coincide at 77 K. It should be noted from curve (a) that peak resistive change ΔR/R of the trilayer junction is less than 10%, which is less than half of the expected change of 21% at this temperature setting (see FIG. 4).

Figure 5:
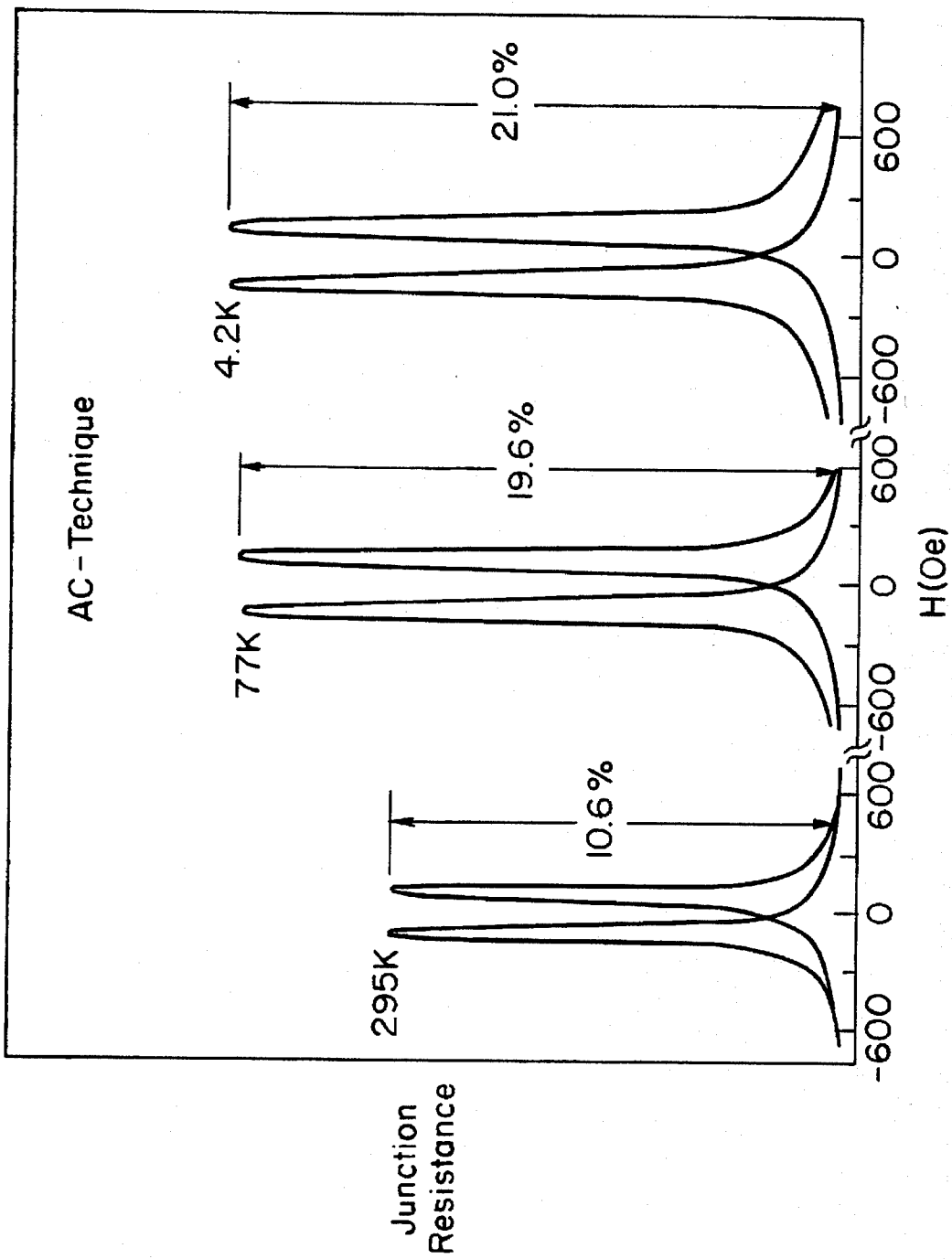
FIG. 5 is a set of plots showing an ac-technique measurement of percent change in tunnel resistance as a function of applied magnetic field for a CoFe/Al$_2$O$_3$/NiFe trilayer junction at three temperature settings.

Most of the detailed studies of resistance change with field and temperature were done using an ac lock-in technique (see FIG. 5). In order to investigate the effect of dc-bias, R vs H for several junctions was studied by applying dc current through the junction. Comparing FIG. 4 (dc-technique) and 5 (ac-technique), results show similar peak position, peak width, and resistive changes with temperature for both techniques.

Figure 6A:
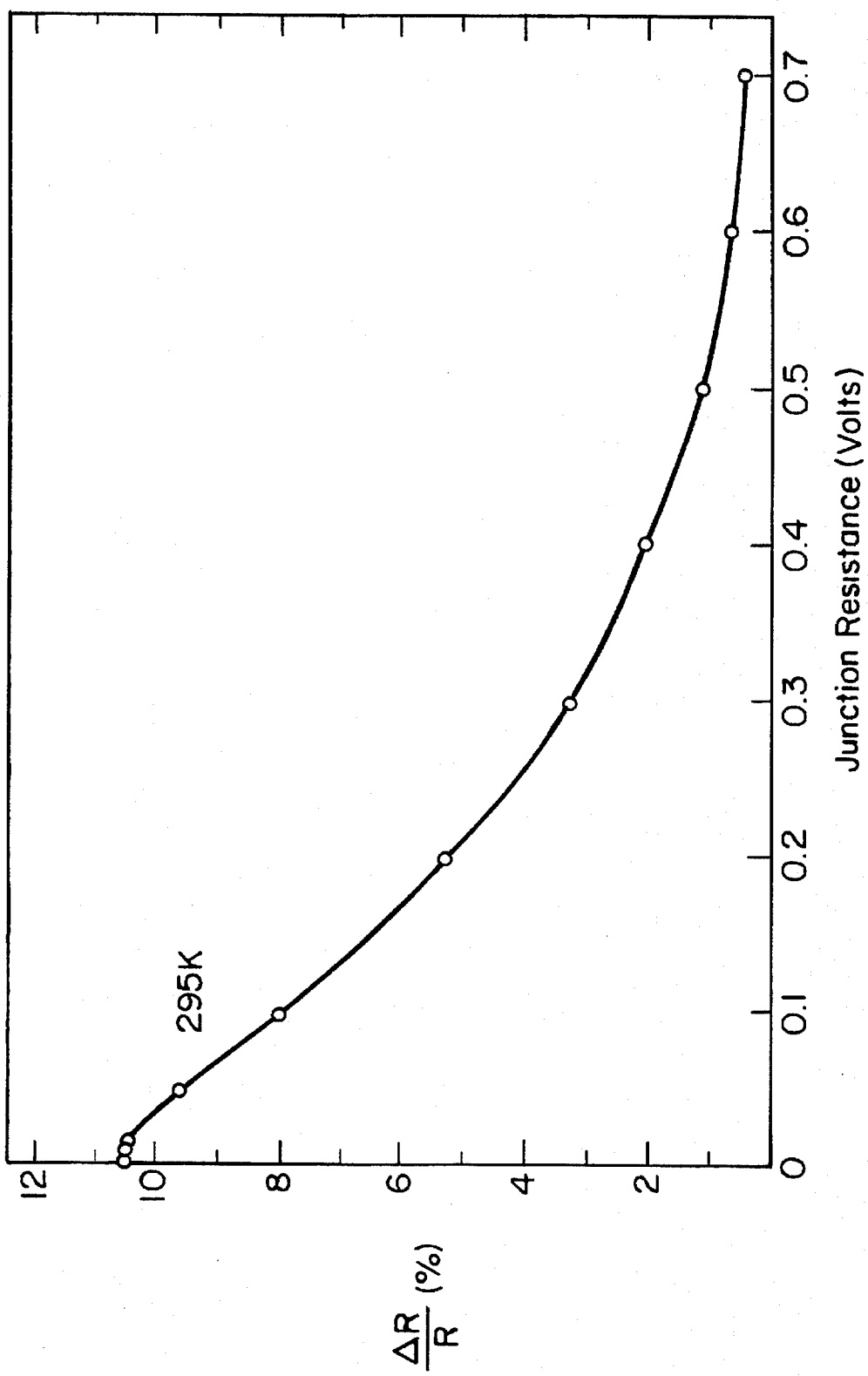
FIG. 6A is a plot showing $\Delta R/R$ in percent as a function of dc-bias for CoFe/Al$_2$O$_3$/Co trilayer junction at 295 K.

FIG. 6A further illustrates the effect of dc-bias on the junction resistance. In FIG. 6A, it can be seen that, up to about 100 mV, there is only a small decrease in ΔR/R from the value measured by the ac technique. However, at large biases there is a significant decrease in the value of ΔR/R.

Figure 6B:
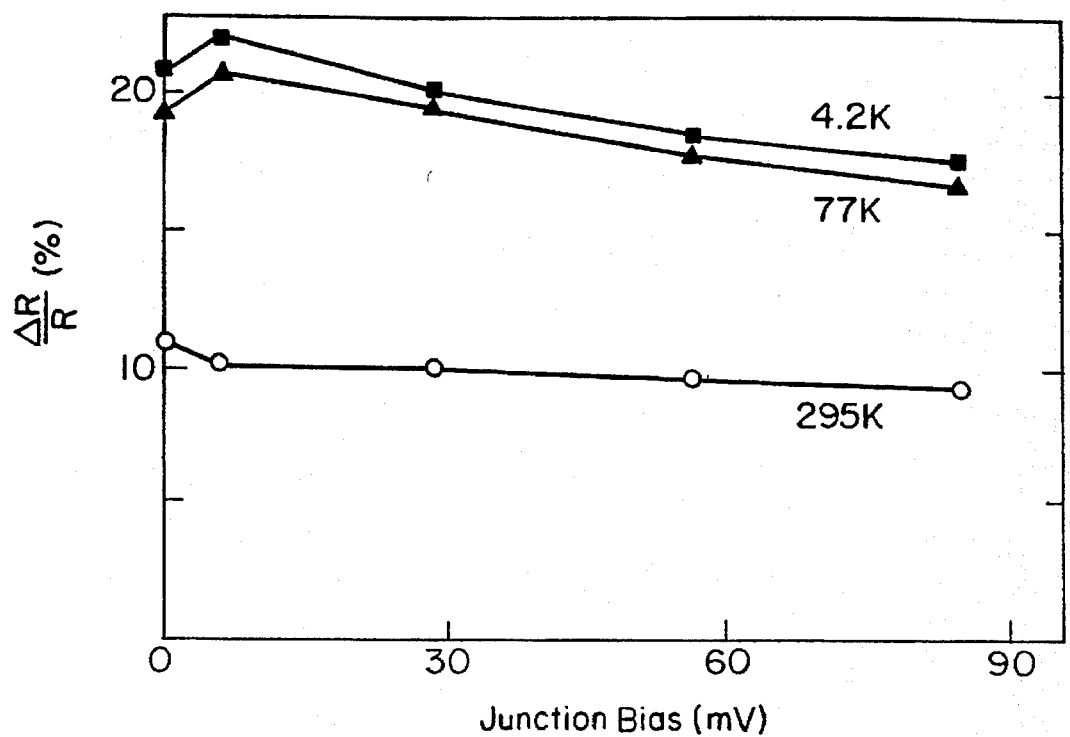
FIG. 6B is $\Delta R/R$ of the trilayer junction in low dc-bias region for three different temperature settings.

The value of ratio obtained by the ac-technique is plotted on the ordinate and shown in FIG. 6B. The decrease observed with increasing dc-bias is similar at all three temperatures in the low bias region.

The field dependence of tunnel resistance in FM-I-FM junctions as shown in FIG. 3A can be explained qualitatively based on earlier models. At high fields (beyond the H$_c$ of the FM films), the magnetization of the two FM films are fully saturated and aligned in the same field direction. The tunneling probability and, hence, the current is high. As H decreases towards zero and changes sign, the magnetization of the film with lower H$_c$ (top FM) reverses its direction, whereas for the film which has the higher value of H$_c$ (bottom FM), the magnetization direction (M) remains the same. In this field range, the magnetization orientation of the two films are antiparallel to each other. At this point, the tunneling probability is lowered. The resistance increases rapidly, and accordingly, the tunnel current drops. Upon raising the field further in the reverse direction, M in the second film also reverses, becoming parallel to the first film. This leads once again to higher tunneling probability and current.

As mentioned above, the magnitude of the change in tunnel current (and the corresponding junction resistance) depends to a large extent on the difference of coercive fields in the FM electrodes. The temperature dependence of the coercive fields can also cause a temperature dependence in the fractional change in resistance. The coercive fields of the CoFe, NiFe and Co films changed by different amounts; Co showing the maximum increase in H$_c$ at lower temperatures. When T decreased, H$_c$ for the two films moved further apart thereby allowing the antiparallel alignment to exist in a wider range of H, and, hence, giving rise to higher change in ΔR/R values. It follows that the peak in the junction resistance occurs at field values between the peak of the CoFe film and the dip of the Co film (see FIG. 2). When the coercive fields of the two films are close and the position of the R(H) peaks of the two films nearly overlap, very small or no change is seen in junction resistance. The temperature dependence of ΔR/R cannot be caused by a change in M because, at thickness of about 100 Å, these FM films behave much like bulk, which have Curie temperatures greater than 1200 K., and, hence, should have negligible effect on M below 295 K. Finally, the effect seen above is independent of the applied field direction with respect to the junction.

Figure 7B:
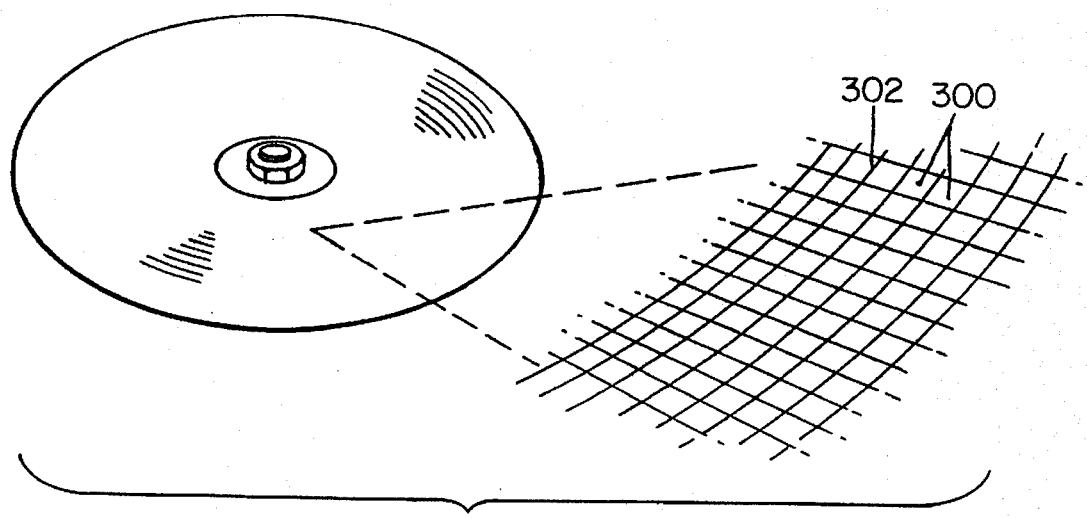
FIG. 7B is an enlarged view of the disk surface coated with FM-I-FM memory cells.
Figure 7C:
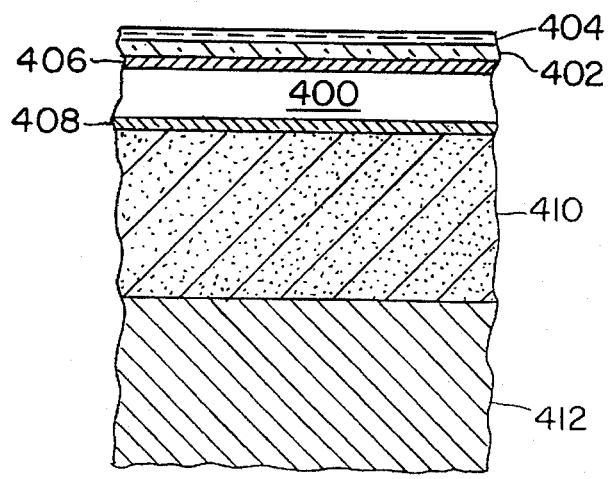
FIG. 7C is a sectional view of the multi-layer disk surface including a layer of FM-I-FM memory cells.
Figure 7A:
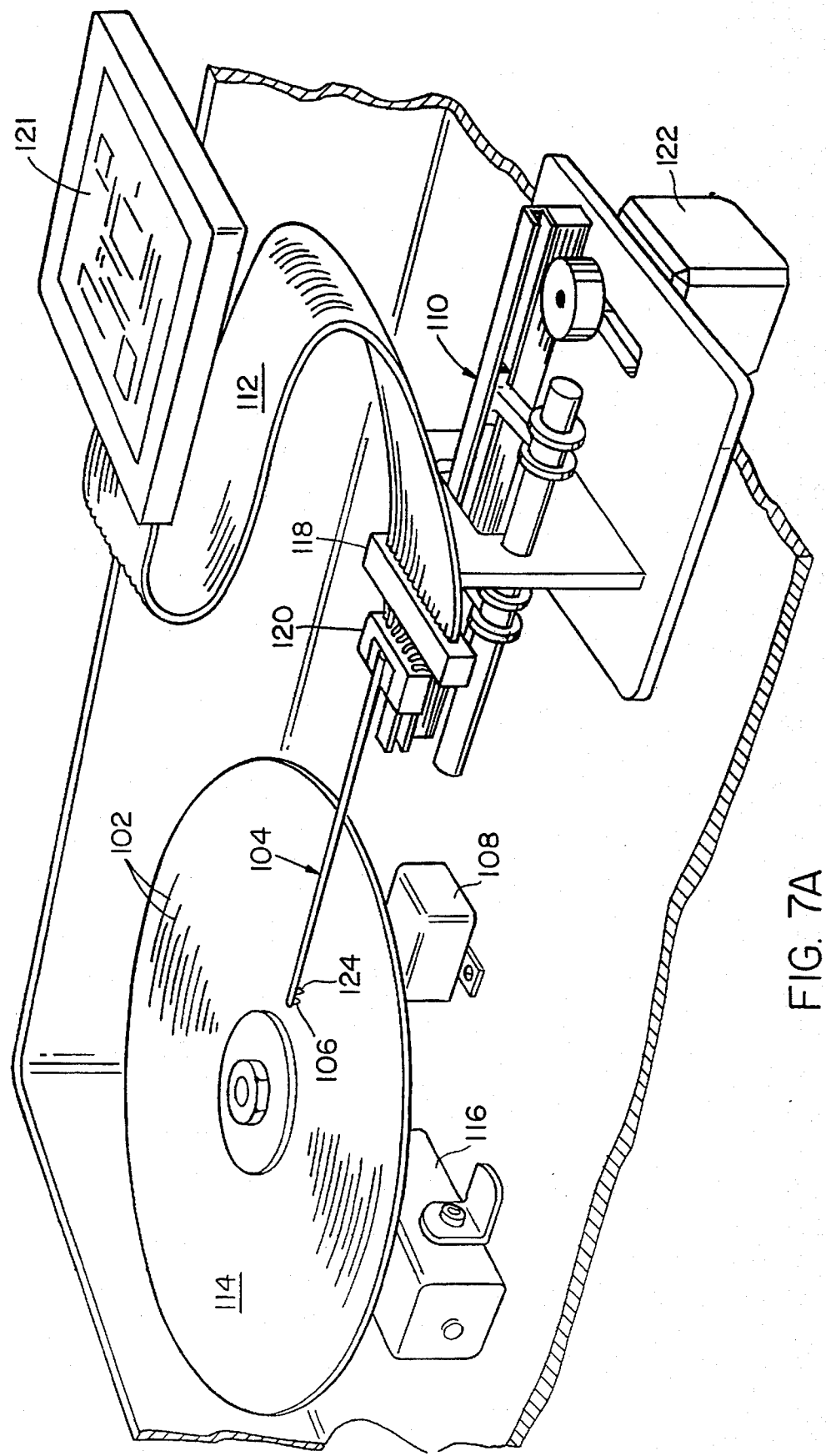
FIG. 7A is schematic prospective drawing of a memory device according to the invention.

FIG. 7A shows a memory storage device wherein a layer of a large number of FM-I-FM trilayer tunnel junctions 102 of the present invention are coated onto a disk surface 114 for storing a series of read-write binary data. FIG. 7B is an enlarged view (top) of such a disk surface prior to applying the protective coating, where an individual FM-I-FM junction cell 300 is isolated from the other by a micro-thin insulator material 302. FIG. 7C is a sectional view of the same disk surface (top half) which includes the layer of FM-I-FM junction 400 below a conducting layer 406, a protective coating 402 and an optional liquid lubricant layer 404. A layer 408 immediately below the trilayer junction is another conducting layer forming a closed-loop system. Below the second conducting layer is an electroless layer 410, and, finally, a substrate layer 412 underlies the entire structure. A group of such FM-I-FM junctions are arranged in a certain pattern to form a "sector", and a group of such sectors are arranged to form a "block". In FIG. 7A, each block or sector of data being written into or retrieved from the disk is particularly addressed for unrestricted access by the central processing unit (CPU) 121.

The memory device of the present invention is nonvolatile, in that, it does not lose data when power is lost. Furthermore, the resistive value of the trilayer junction, which represents a binary high ("1") or low ("0") can be maintained passively, requiring very little or no steady state external power. For example, a micro-coil 106 at the proximal end of a movable head 104 provides applied electromagnetic energy to affect the magnetization directions and to set the binary states of the individual sectors of FM-I-FM tunnel junctions. Once the binary states are set, the electromagnetic energy is no longer needed (i.e., switched off) to maintain such states. This operation may be illustrated by the circuit in FIG. 1, wherein the coil 16 performs the equivalent function as the micro-coil 106 in FIG. 7A. Such application of electromagnetic energy constitutes writing operation whereby the changes in resistance states of individual FM-I-FM junction cells correspond to a new entry of binary ones and zeroes. A sensor head 124 near the proximal end of such movable head and adjacent to the micro-coil 106 performs a read operation by either measuring conductance or magnetic field across the FM-I-FM tunnel junctions. A read operation by measuring conductance can be illustrated by the circuit in FIG. 1. The sensor head of the present figure functions as the current source as shown in FIG. 1, then, by measuring the corresponding voltage drop, the resistance of a particular FM-I-FM junction cell can easily be determined. The positional head is controlled by a controller 120 and is coupled to an actuator device 110. The coupled unit comprising positional head and the actuator is then driven by a stepping motor 122 A data path 112 carries instructional signals and data issued by the CPU (central processing unit). These are received and routed by a disk interface 118 to appropriate operators in the system. The instructional signals include a set of control signals routed to the controller for displacing the positional head. The instructional signals also include a signal to drive a high speed motor 116 coupled to the disk to displace the disk to a proper reading or writing orientation. A multi-output power supply 108 includes separate voltage lines to power the disk motor 116 as well as the stepping motor 122.

Figure 8:
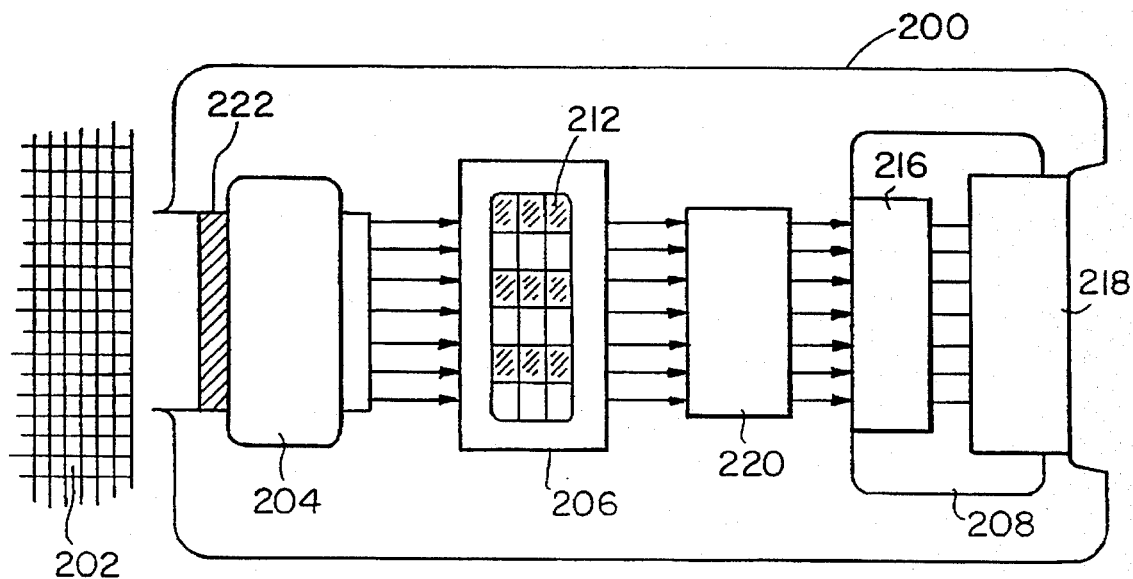
FIG. 8 is a schematic drawing of a sensor device according to the invention.

FIG. 8 shows a high precision multi-sensor system 200 wherein an integrated circuit (IC) 206 comprises a plurality of FM-I-FM trilayer tunnel junctions 212 of the present invention. Block 202 represents an arbitrary set of conditions (i.e., temperature, air pollutants, gas, etc.) being monitored by the system. A set of physical parameters corresponding to these conditions are quantified by a sensor interface 222, and then electrically transduced by a signal transducer 204 into a particular range of magnetic field values. The FM-I-FM junctions are arranged to form a matrix array of information carrying bits, wherein each bit is either a binary "1" or "0". Multiple-bit words (e.g., 8-bit, 16-bit, 32-bit etc.) are constructed as required to record and monitor physical conditions continuously. The information contained in the IC matrix is digitally sampled and decoded by a decoder 220. An output device 208 comprising a recording device 216 and a display device 218 processes decoded data in real time.

FIG. 9A illustrates yet another embodiment of the present invention involving a high performance sensor. FIG. 9A is a schematic of a portion of magnetic storage disk drive using a sensor in accordance with the invention having a rotatable disk 502, a stepping motor 504, a position actuator 506, and a read-write sensor head 508. The inset in FIG. 9B shows an enlarged view of the read-write sensor head 508 comprising two FM-I-FM trilayer junctions 510 placed near the top and bottom surfaces of the disk. These surfaces of the disk are magnetically coated. Each of these magnetic surfaces is made up of cells representing bits of binary data. Each cell has a magnetization direction which is detectible by the sensor head (e.g., a cell having a high bit would cause to change the magnetization direction of the trilayer junction on the sensor head thereby creating a signal voltage). The actuator 506, coupled to the sensor head 508, moves the sensor head linearly or angularly across the disk surface to read or write binary information. The stepping motor 504 linearly drives the actuator. The sensor head made according to the present invention provides significantly improved signal-to-noise ratio at reduced weight, size and power consumption over the conventional heads. A sensor head comprising FM-I-FM junctions can easily be integrated into other forms of magnetic storage devices such as tape and floppy drives by replacing the existing read-write mechanism.

Equivalents

While the invention has been described in connection with specific methods and apparatus, it is to be understood that the description is by way of example and not as a limitation to the scope of the invention as set forth in the claims.

We claim:

1. A device forming a junction having a resistance comprising:
   a first electrode having a first magnetization direction,
   a second electrode having a second magnetization direction, and
   an electrical insulator between the first and the second electrodes, wherein applying a small magnitude of electromagnetic energy to the junction reverses at least one of the magnetization directions and causes a change in the resistance by at least 10% at room temperature.

2. The device of claim 1, wherein the first and the second electrodes are ferromagnetic, and the first electrode has a coercive magnetic field of different magnitude than that of the second electrode.

3. The device of claim 1, wherein the first and the second electrodes have melting points greater than 1000 degrees Celsius and conduction electron spin polarization values greater than 0.3.

4. The device of claim 1, wherein the insulator forms a tunnel barrier layer between the first and the second electrodes.

5. The device of claim 1, wherein the junction forms a tunnel junction.

6. A memory system comprising a thin film device forming a junction having a resistance comprising:
   a first film layer having a first magnetization direction,
   a second film layer having a second magnetization direction, and
   an electrical insulator film layer placed in between the first and the second film layers, wherein applying a small magnitude of electromagnetic energy to the junction reverses at least one of the magnetization directions and causes a change in the resistance by at least 10% at room temperature.

7. The memory system of claim 6, wherein the first and the second film layers are ferromagnetic.

8. The memory system of claim 6 further comprising a switched electromagnetic energy source for reversing at least one of the magnetization directions.

9. A method of forming a trilayer tunneling device comprising the steps of:
   cooling a flat smooth substrate surface inside a vacuum evaporation apparatus,
   overlaying a thin seeding layer having relatively high melting point onto the substrate surface,
   overlaying a first ferromagnet layer onto the seeding layer,
   overlaying a precursor film onto the first ferromagnet layer,
   bringing the layers to room temperature and oxidizing the precursor film by a glow discharge in oxygen to form an insulating tunnel barrier layer, and
   overlaying a second ferromagnet layer on the insulating tunnel barrier at room temperature.

10. The method of claim 9, wherein the pressure setting for the vacuum evaporation apparatus is at least $10^{-7}$ Torr.

11. The method of claim 9, wherein the substrate is a glass substrate.

12. The method of claim 9, wherein the first and the second ferromagnet layers have coercive forces in the range of about 1 Oe to 1000 Oe, melting points greater than 1000 degrees Celsius, and conduction electron spin polarization values greater than 0.3.

13. The method of claim 9, wherein the seeding layer has melting point greater than 1000 degrees Celsius.

14. The method of claim 9, wherein the insulating layer forms a thin tunnel barrier layer between the first and the second ferromagnet layers.

15. The method of claim 9, wherein the first and the second ferromagnet layers are ferromagnets selected from the group consisting of cobalt iron, nickel manganese antimony, platinum manganese antimony, manganese bismuth, nickel iron, cobalt, chromium, chromium oxide or iron.

16. A memory device for storing binary data comprising:
   a substrate coated with a thin film comprising a plurality of trilayer devices, each having a junction with a resistance, wherein each device comprises:
   a first film layer having a first magnetization direction,
   a second film layer having a second magnetization direction, and
   an electrical insulator layer between the first and the second film layers, wherein applying a small magnitude of electromagnetic energy to the junction reverses at least one of the magnetization directions and causes a change in the resistance by at least 10% at room temperature.

17. The memory device of claim 16, wherein the first and the second film layers are ferromagnetic, and the first film layer has a coercive magnetic field force of different magnitude than that of the second film layer.

18. The memory device of claim 16, wherein the first and the second film layers have melting points greater than 1000 degrees Celsius and conduction electron spin polarization values greater than 0.3.

19. The memory device of claim 16, wherein the insulator layer forms a tunnel barrier layer between the first and the second film layers.

20. The memory device of claim 16, wherein the resistance of each junction indicates a binary state such that the change in the resistance correspondingly changes the binary state, and such state can be maintained without the electromagnetic energy.

21. The memory device of claim 16, wherein each trilayer junction forms a tunnel junction.

22. The memory device of claim 16 further comprising:
   a movable head comprising,
      a micro-coil device at the proximal end of the movable head for applying a predetermined electromagnetic energy across the junction for affecting the magnetization direction, and
      a sensor device for measuring electromagnetic energy across the junction.

23. A memory device for storing binary data comprising:
   a movable read-write sensor head comprising two trilayer devices, each having a junction with a resistance, separated by a gap, wherein each device comprises:
   a first film layer having a first magnetization direction,
   a second film layer having a second magnetization direction, and
   an electrical insulator layer between the first and the second film layers, wherein applying a small magnitude of electromagnetic energy to the junction reverses at least one of the magnetization directions and causes a change in the resistance by at least 10% at room temperature.

24. The memory device of claim 23, wherein the first and the second film layers are ferromagnetic, and the first film layer has a coercive magnetic field of different magnitude than that of the second film layer.

25. The memory device of claim 23, wherein the first and the second film layers have melting points greater than 1000 degrees Celsius and conduction electron spin polarization values greater than 0.3.

26. The memory device of claim 23, wherein the insulator layer forms a tunnel barrier layer between the first and the second film layers.

27. The memory device of claim 23, wherein the resistance of each junction indicates a binary state such that the change in the resistance correspondingly changes the binary state, and such state can be maintained without the electromagnetic energy.

28. The memory device of claim 23, wherein each trilayer junction forms a tunnel junction.

29. The memory device of claim 23 further comprising:
   a disk having two magnetically coated surfaces fixed in the gap between the two junctions so that an interface between one surface and one of the junctions and another interface between the other surface and the other junction are formed in a stack;
   an actuator coupled to the sensor head for positioning the sensor head across both surfaces of the disk simultaneously; and
   a stepping motor coupled to the actuator for linearly driving the actuator.

30. A sensor device comprising:

an integrated circuit comprising a plurality of trilayer devices, each having a junction with a resistance, in a matrix array forming binary bits, wherein each device comprises:

a first film layer having a first magnetization direction, a second film layer having a second magnetization direction, and an electrical insulator layer between the first and the second film layers, wherein applying a small magnitude of electromagnetic energy to the junction reverses at least one of the magnetization directions and causes a change in the resistance by at least 10% at room temperature.

31. The sensor device of claim 30, wherein the first and the second film layers are ferromagnetic, and the first film layer has a coercive magnetic field of different magnitude than that of the second film layer.

32. The sensor device of claim 30, wherein the first and the second film layers have melting points greater than 1000 degrees Celsius and conduction electron spin polarization values greater than 0.3.

33. The sensor device of claim 30, wherein the insulator layer forms a tunnel barrier layer between the first and the second film layers.

34. The sensor device of claim 30, wherein the resistance of each junction indicates a binary state such that the change in the resistance correspondingly changes the binary state, and such state can be maintained without the electromagnetic energy.

35. The sensor device of claim 30, wherein each trilayer junction forms a tunnel junction.

36. The sensor device of claim 30 further comprising a signal transducer coupled to the integrated circuit for transducing a plurality of electrical signals into electromagnetic energy directed to the matrix array, wherein the electromagnetic energy affects the magnetization direction to cause a change in the binary bits.

* * * * *